United States Patent [19]

Oka et al.

[11] Patent Number: 5,085,166
[45] Date of Patent: Feb. 4, 1992

[54] LASER VAPOR DEPOSITION APPARATUS

[75] Inventors: Kazuhiro Oka; Takeshi Morita; Seigo Hiramoto; Toshio Kagawa, all of Amagasaki, Japan

[73] Assignee: Mitsubishi Denki Kabushiki Kaisha, Tokyo, Japan

[21] Appl. No.: 519,832

[22] Filed: May 7, 1990

[30] Foreign Application Priority Data

May 24, 1989 [JP] Japan .................................. 1-131807

[51] Int. Cl.$^5$ ...................... C23C 14/24; C23C 14/28
[52] U.S. Cl. .................... 118/50.1; 118/620; 118/723; 118/726; 118/727; 118/719; 219/121.84; 219/121.86; 427/53.1
[58] Field of Search ..................... 118/50.1, 620, 723, 118/719, 726, 727; 427/53.1; 219/121.6, 121.65, 121.66, 121.84, 121.85, 121.86

[56] References Cited

U.S. PATENT DOCUMENTS

| | | | |
|---|---|---|---|
| 4,758,388 | 7/1988 | Hamada et al. | 264/25 |
| 4,816,293 | 3/1989 | Hiramoto et al. | 427/53.1 |
| 4,861,750 | 8/1989 | Nogawa et al. | 505/1 |
| 4,874,741 | 10/1989 | Shaw et al. | 505/1 |
| 4,920,094 | 4/1990 | Nogawa et al. | 505/1 |

FOREIGN PATENT DOCUMENTS

| | | |
|---|---|---|
| 62-230 | 6/1987 | Japan . |
| 64-42351 | 2/1989 | Japan . |

Primary Examiner—Shrive Beck
Assistant Examiner—Margaret Burke
Attorney, Agent, or Firm—Morrison Law Firm

[57] ABSTRACT

A laser vapor deposition apparatus includes a vacuum chamber which includes an exhaust port and in which a material to be vaporized and a substrate are enclosed, a laser beam source for irradiating the material to be vaporized with a laser beam so as to deposit from the material a desired compound onto the substrate, and a gas supply source which supplies to the surface of the material, a gas that can prevent changes in property of the material which could be caused by the laser beam irradiation.

27 Claims, 3 Drawing Sheets

LASER VAPOR DEPOSITION APPARATUS

This invention relates to a laser vapor deposition apparatus for vapor depositing a compound onto a substrate.

BACKGROUND OF THE INVENTION

A conventional laser vapor deposition apparatus, such as the one shown in Japanese Unexamined Patent Publication No. SHO 59-116373, is shown in FIG. 1. In FIG. 1, a laser beam 1 changes its direction at a first plane mirror 2, and is condensed by a lens 3. The condensed laser beam 1 is introduced into a vacuum chamber 4 through a transparent window 5 formed in a wall of the chamber 4. The laser beam 1 which has entered into the vacuum chamber 4 through the window 5 changes its direction again at a second plane mirror 7 disposed within the chamber 4, so that the laser beam 1 impinges on the surface of a cylindrically shaped material 6 to be irradiated with the beam 1. The material 6 is disposed within the chamber 4 and rotates in a direction indicated by an arrow A. A heater 8 heats the whole material 6. A substrate 9 is disposed to face the material 6, and a shutter 10 is disposed between the material 6 and the substrate 9.

In operation, the laser beam 1 changes its direction at the first plane mirror 1 to pass through the lens 3 which condenses the laser beam 1, and enters into the vacuum chamber 4 through the transparent window 5. The second plane mirror 7 causes the beam 1 to change its direction again toward the surface of the material 6 which has been heated to a predetermined temperature by the heater 8. The focal length and the position of the condenser lens 3 are such that the focus point is located in the vicinity of a point on the material 6 to be irradiated with the laser beam 1. In the initial stage of the processing, when conditions are unstable, the surface of the substrate 9 is shielded by the shutter 10.

After various conditions have become stabilized, the shutter 10 is removed so that the substrate surface directly faces the material 6. The temperature at the surface of the material 6 irradiated with the laser beam 1 increases rapidly so that the material 6 is vaporized. The vapor of the material 6 is sputtered toward the substrate 9 and deposited on the substrate 9. The cylindrically shaped material 6 rotates in the direction A, and successive portions of the surface of the material 6 are heated and irradiated with the laser beam 1, and the material is vaporized and deposited to form a film on the substrate 9. In this process, part of the surface layer of the material 6 irradiated with the laser beam 1 is thermally decomposed. Those decomposition products which are more readily vaporizable are first vaporized from the surface of the material 6, and spread within the vacuum chamber 4 and exhausted out of the chamber 4. Then, even when the material 6 rotates so that the portion which has been irradiated moves out of the focus point of the laser beam 1, resulting in decrease of the temperature at that portion, and, accordingly, discontinuity of the thermal decomposition at the surface of the material 6, the composition of the surface layer of the material 6 to be irradiated with the laser beam 1 is no longer the same as the starting compound.

With the above-described conventional laser vapor deposition apparatus, the physical properties, such as the laser beam absorption coefficient and thermal conductivity, of the surface portion of the material 6 change more and more as they are irradiated more with the laser beam 1, so that the rate of evaporation of the material 6 cannot be maintained stable, and, furthermore, the composition of the deposit on the substrate cannot be maintained unchanged throughout the deposition process.

Therefore, an object of the present invention is to provide a laser vapor deposition apparatus which is free of the above-stated disadvantages, and in which a rate of evaporation of a material can be maintained stable and also the composition of the vapor deposited film can be maintained unchanged throughout the deposition.

SUMMARY OF THE INVENTION

According to the present invention, a laser vapor deposition apparatus includes a source of gas which can prevent properties of a material to be vaporized from changing. The gas is supplied in the vicinity of the surface portion of the material where a laser beam is incident.

DETAILED DESCRIPTION OF THE INVENTION

Now, the present invention is described in detail with reference to the accompanying drawings.

Figure 2:
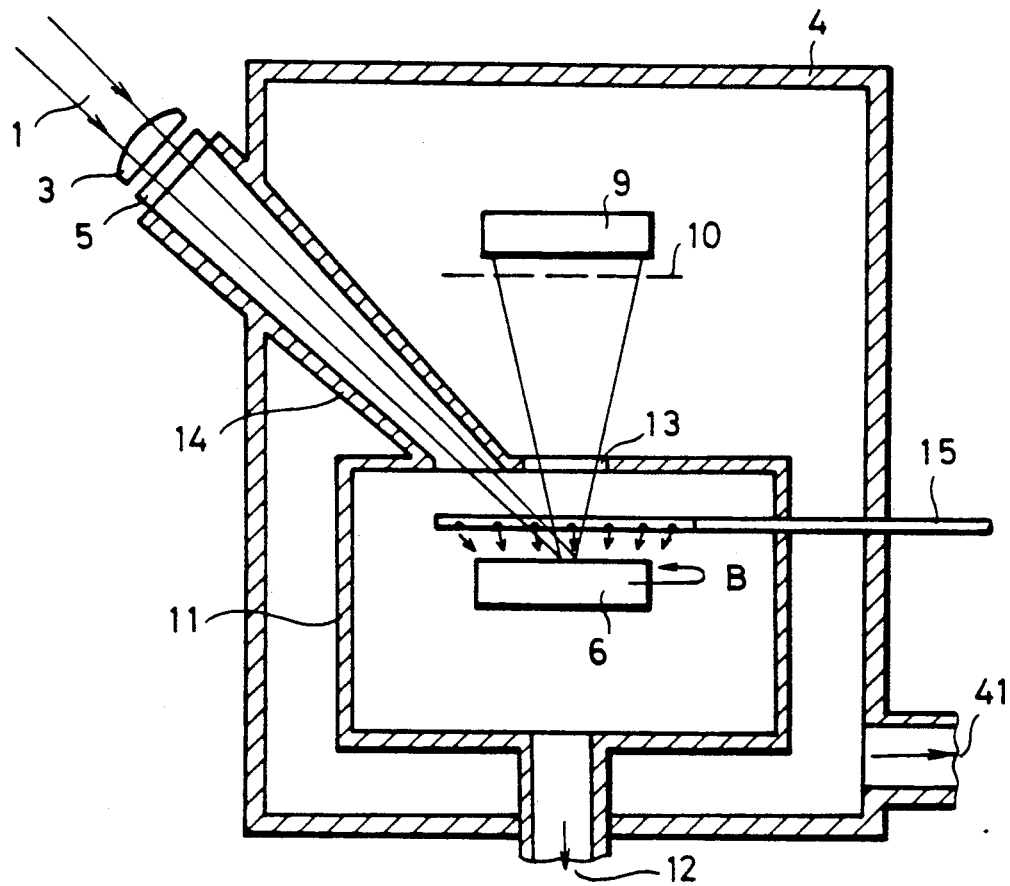
FIG. 2 shows a schematic arrangement of a laser vapor deposition apparatus according to one embodiment of the present invention.
Figure 3A:
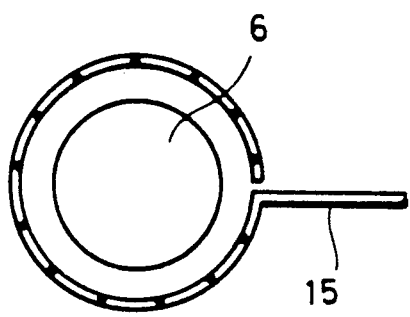
FIGS 3(a) and 3(b) show, in plan, examples of gas supply tubes having shapes conforming to the shape of a material to be vaporized, which may be use in the apparatus of the present invention.
Figure 3B:
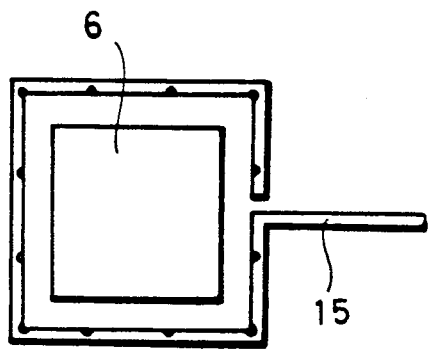

In FIG. 2, a laser vapor deposition apparatus according to a first embodiment of the present invention is schematically shown. In FIGS. 3(a) and 3(b), shapes of gas supply tubes which may be used in the apparatus of the present invention are shown. The shape of the gas supply tube is selected to conform with the shape of a material to be vaporized. In FIG. 3(a), the material is disc-shaped, and the material in FIG. 3(b) is rectangular.

Figure 1:
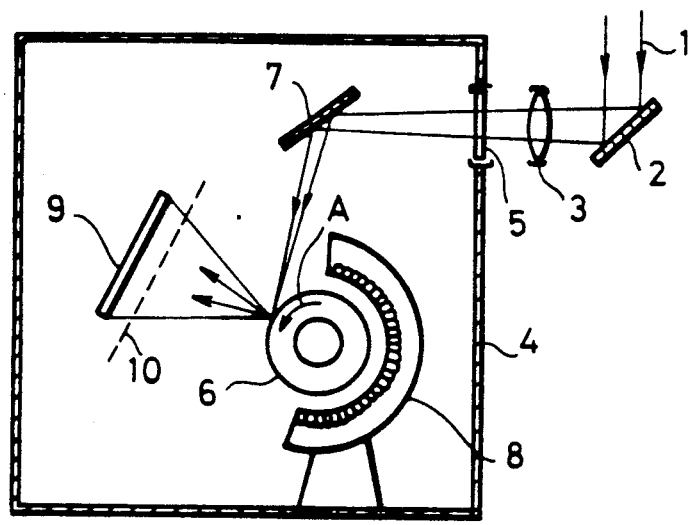
FIG. 1 shows a schematic arrangement of a conventional laser vapor deposition apparatus.

In FIG. 2, a vacuum chamber 4 is evacuated through an exhaust port 41. A material 6 to be vaporized is, for example, an oxide, such as CuO, and is, for example, disc-shaped. The disc-shaped material 6 rotates in a direction indicated by an arrow B, with the center of rotation moving back and forth and right and left. A housing 11 in which the material 6 to be vaporized is placed is disposed within the chamber 4. An exhaust port 12 is formed in a wall of the housing 11. The housing 11 is also provided with an orifice 13 through which vapor of the material 6 is directed to a substrate 9 disposed also within the chamber 4. A laser beam introducing tubular member 14 is coupled integral with the vacuum chamber 4 and the housing 11. The tubular member 14 includes a transparent window 5 at its top end, through which a $CO_2$ laser beam 1 enters into the tubular member 14 and impinges on the material 6 to be vaporized. A gas supply tube 15 extends into the housing 11 from outside the chamber 4 and has apertures at its inner end portion shaped to surround the material 6 within the housing for releasing a gas onto the surface of the material 6. The inner end portion of the tube 15 in this example is ring-shaped as shown in FIG. 3(a). In this example, $O_2$ gas is released out of the apertures in the tube 15. The remaining portions of the apparatus are similar to corresponding portions of the conventional apparatus shown in FIG. 1.

In operation, the material 6 to be vaporized is placed in the housing 11, and the vacuum chamber 4 is evacuated through the exhaust port 41 to a vacuum of $1 \times 10^{-4}$ Torr. Then, the housing 11 and, accordingly, the chamber 4 are evacuated through the exhaust port 12 at a greater rate than the exhaust port 41, while the $O_2$ gas is being released from the apertures in the tube 15 toward the surface of material 6. Next, the $CO_2$ laser beam 1 is directed to the surface of the material 6 to vaporize it. Vapor of the material 6 passes through the orifice 13 and is deposited to form a film on the substrate 9.

In this process, the surface portion of the material 6 the temperature of which has risen due to irradiation with the $CO_2$ laser beam 1 may thermally decompose. Out of the decomposition products, more readily vaporizable one, such as oxygen, will spread over the interior of the chamber 4 or will be exhausted out through the exhaust ports 41 and 12, which could cause the surface portion of the material 6 to become oxygen-poor. That is, the surface portion may change to comprise $Cu_2O$ and Cu, for example. However, since $O_2$ is supplied from the gas supply tube 15 which is located in the vicinity of the surface portion of the material 6, when the temperature of the material surface which has been irradiated with the laser beam 1 decreases as the material 6 is rotated with the center of the material 6 moving to and fro so that the laser beam 1 comes to be incident on a different portion, the reverse reaction takes place so that the surface composition will return to the original $CuO_2$, i.e. the material having the same physical properties, such as the laser absorption coefficient, the thermal conductivity etc. as those of the material before irradiation. Then the material having the same properties is irradiated with the $CO_2$ laser beam 1 throughout the process. Thus, the evaporation of the material 6 can be maintained stable. The remaining portion of the $O_2$ gas other than the portion used for the reaction at the material surface is instantaneously exhausted through the exhaust port 12, and, therefore, no $O_2$ gas will reach the substrate or leak into the vapor atmosphere in front of the substrate 9. Accordingly, substantially no adverse influence is given to the properties of the compound formed on the substrate 9 and the rate of the vapor deposition.

There is no special restriction on the shape of the material 6 to be vaporized, and the inner end portion of the gas supply tube 15 can have any shape suitable for the shape of the material 6. For example, if the material 6 is shaped into a rectangular plate, the inner end portion of the gas supply tube 15 is correspondingly shaped into a rectangule as shown in FIG. 3(b).

In place of the $CO_2$ laser, high energy light, such as YAG laser light and ArF and KrF excimer laser light, can be used. Further, either continuous light or pulsating light can be used.

In order to change the position on the surface of the material 6 where the laser beam 1 is incident, the material 6 may be moved zigzag, or, instead, the condenser lens 3 may be moved so as to cause the laser beam 1 to scan the surface of the material 6 to be vaporized.

In the above-described embodiment, $O_2$ is released from the gas supply tube 15, but any oxidizing gas, such as $N_2O$ and $O_3$, can be used.

Furthermore, in the above-described embodiment, CuO is used as the material 6 to be vaporized, but Cu can be used instead, since the surface portion of such a Cu material has been oxidized and changed to CuO. Accordingly, the same compound can be formed on the substrate 9 as in the case where CuO per se is used as the material 6.

In the foregoing description of the invention, an oxide is exemplified as the material 6 to be vaporized. However, deposits from other compounds, such as nitrides and carbides, can be similarly formed if an appropriately selected gas is released from the apertures in the gas supply tube 15. For instance, $N_2$ gas may be used for nitrides, and $C_2H_2$ or $CCl_4$ gas may be used for carbides.

Figure 4:
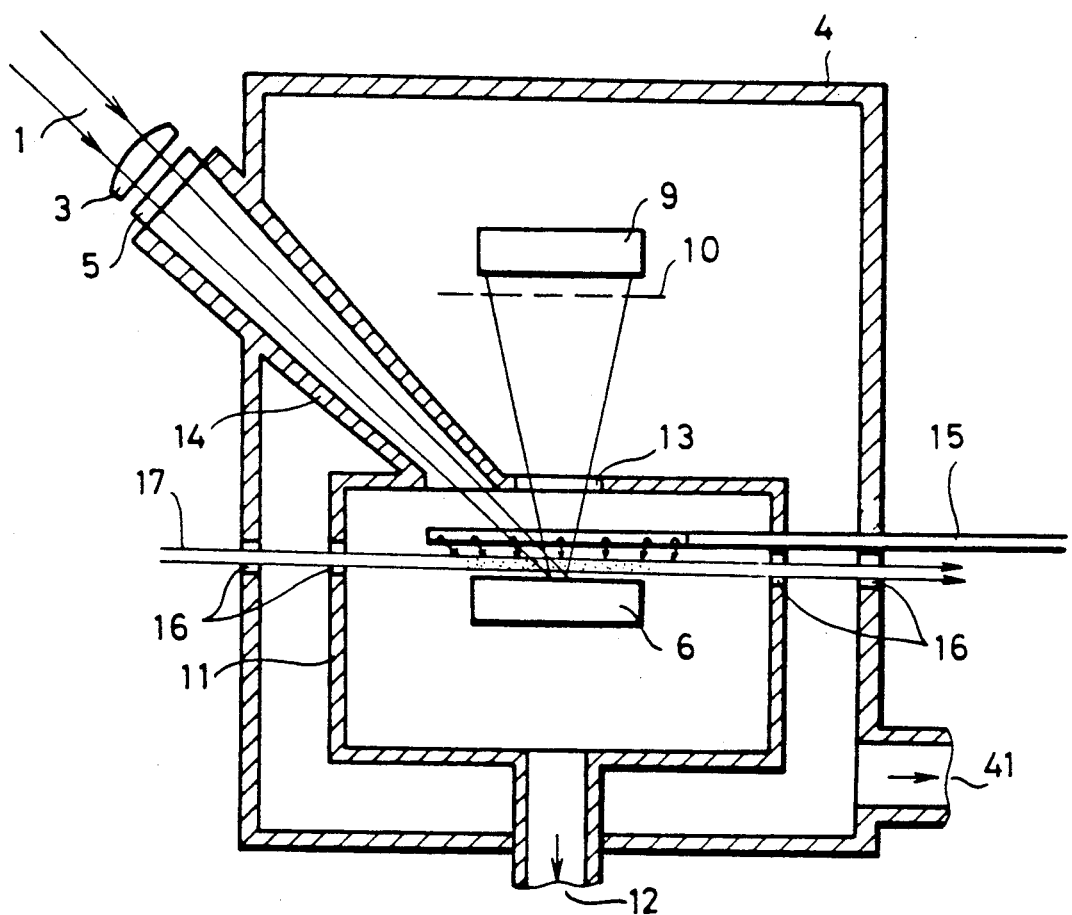
FIG. 4 shows a schematic arrangement of a laser vapor deposition apparatus according to another embodiment of the present invention, in which an additional laser beam is used to increase the reactivity of the gas released from the gas supply tube.

In another aspect of the present invention, as shown in FIG. 4, an additional laser beam 17 from, for example, an ArF excimer laser or a KrF excimer laser, which can dissociate the gas released from the gas supply tube 15, is projected through laser transmissive windows 16 in the chamber 4 and the housing 11 to the gas in the vicinity of the surface of the material to be vaporized, so that the reactivity of the gas is increased.

In still another aspect of the present invention, electrodes of a DC electric field generator or an AC electric field generator may be placed between the gas supply tube 15 and the material 6 to be vaporized, to thereby apply an electric field to the gas to convert the gas into plasma.

Rather than supplying gas by means of the gas supply tube 15, an ion gun or an ozonizer may be used to supply ionized gas to the surface of the material 6 to be vaporized.

Figure 5:
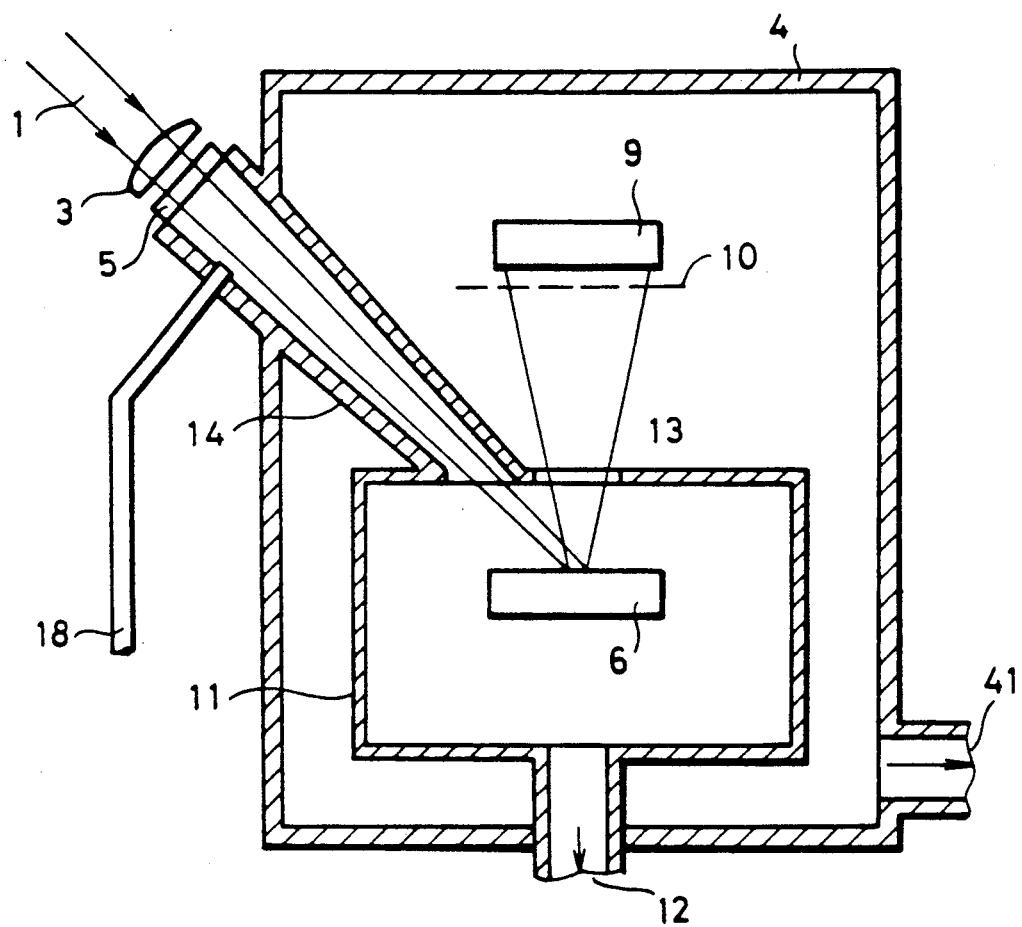
FIG. 5 shows a schematic arrangement of a laser vapor deposition apparatus according to still another embodiment of the present invention, in which a different gas supply arrangement is used.

Alternatively, as shown in FIG. 5, instead of the gas supply tube 15, a gas supply tube 18 which opens into the laser beam introducing tubular member 14 may be used to supply gas through the tubular member 14 onto the surface of the material 6 to be vaporized.

In the embodiments described above, the housing 11 with the exhaust port 12 is disposed within the chamber 4 and excessive gas is exhausted through the port 12. However, the housing 11 can be eliminated by disposing the exhaust port 41 of the chamber 4 at a location remote from the substrate 9 and close to the apertures of the gas supply tube 15 and increasing exhaustion capability through the port 41 so that excessive gas neither can reach the surface of the substrate 9 nor leak into the atmosphere in front of the substrate 9.

As described above, according to the present invention, a gas supply source is disposed near the laser beam incident surface of a material to be vaporized, in order to prevent properties of the material from changing. Thus, with the laser vapor deposition apparatus according to the present invention, the evaporation rate can be maintained stable, and the composition of the deposit on the substrate can be maintained unchanged throughout the deposition process.

What is claimed is:

1. A laser vapor deposition apparatus comprising:
   a vacuum chamber, having an exhaust port, for enclosing therein a material to be vaporized and a substrate;
   a laser beam source for irradiating said material with a laser beam to thereby vaporize said material, so that a desired film is deposited on said substrate;
   a gas supply source for supplying, in the vicinity of the surface of said material, a gas which can prevent changes in properties of said material which could be caused by the irradiation with said laser beam;
   means for withdrawing said gas from said vacuum chamber substantially without permitting said gas to contact said substrate, whereby said substrate remains unaffected by said gas.

2. A laser vapor deposition apparatus according to claim 1 wherein said gas supply source includes a gas supply tube which extends into said chamber through a wall of said chamber and has its inner end portion located in the vicinity of the surface of said material to be vaporized by laser beam irradiation, said gas being released from said inner end portion of said gas supply tube toward the surface of said material.

3. A laser vapor deposition apparatus according to claim 1 further comprising means for moving at least one of said material and said laser beam so that the portion of the surface of said material to be irradiated with said laser beam changes.

4. A laser vapor deposition apparatus according to claim 1 wherein a shutter is disposed between said material to be vaporized and said substrate, said shutter being operated to shield the surface of said substrate during unstable evaporation.

5. A laser vapor deposition apparatus according to claim 1 further comprising means for irradiating said gas in the vicinity of the surface of said material with an additional laser beam which can disassociate said gas, so that the reactivity of said gas is increased.

6. A laser vapor deposition apparatus according to claim 1 wherein electrodes of an electric field generator are disposed between said gas supply source and said material to be vaporized in order to convert the gas into plasma.

7. A laser vapor deposition apparatus according to claim 1 wherein said gas supply source is an ion gun.

8. A laser vapor deposition apparatus according to claim 1 wherein said gas supply source is an ozonizer.

9. A laser vapor deposition apparatus comprising:
   a vacuum chamber, having an exhaust port, for enclosing a substrate;
   a housing disposed within said vacuum chamber for enclosing a material to be vaporized;
   a laser beam source for irradiating said material disposed in said housing with a laser beam to vaporize said material in order to deposit a desired film on said substrate;
   a gas supply source for supplying, in the vicinity of the surface of said material, a gas which can prevent properties of said material from changing;
   vapor of said material being led to said substrate through a window formed in a wall of said housing; and
   means for exhausting said gas from said housing without permitting a substantial amount of said gas to contact said substrate, whereby effectiveness of said gas is generally confined to said material.

10. A laser vapor deposition apparatus according to claim 9 wherein said means for exhausting includes a gas supply tube which extends into said housing through walls of said chamber and housing and has its inner end portion located in the vicinity of the surface of said material to be vaporized by laser beam irradiation, said gas being released from said inner end portion of said gas supply tube toward the surface of said material.

11. A laser vapor deposition apparatus according to claim 9 wherein at least one of said material and said laser beam is movable so that the portion of the surface of said material to be irradiated with said laser beam changes.

12. A laser vapor deposition apparatus according to claim 9 wherein a laser beam introducing tubular member is disposed to extend through a wall of said vacuum chamber and open into said housing, said laser beam being incident onto said material disposed in said housing through said tubular member.

13. A laser vapor deposition apparatus according to claim 9 wherein a shutter is disposed between said material to be vaporized and said substrate, said shutter being operated to shield the surface of said substrate during unstable evaporation.

14. A laser vapor deposition apparatus according to claim 9 wherein said means for exhausting includes an additional exhaust port in said housing, and said gas to be exhausted from said housing is mainly exhausted through said additional exhaust port.

15. A laser vapor deposition apparatus according to claim 9 wherein said gas in the vicinity of the surface of said material is irradiated with an additional laser beam which can dissociate said gas, so that the reactivity of said gas is increased.

16. A laser vapor deposition apparatus according to claim 9 wherein electrodes of an electric field generator are disposed between said gas supply source and said material to be vaporized in order to convert the gas into plasma.

17. A laser vapor deposition apparatus according to claim 9 wherein said gas source is an ion gun.

18. A laser vapor deposition apparatus according to claim 9 wherein said gas supply source is an ozonizer.

19. A laser vapor deposition apparatus comprising:
   a vacuum chamber, having an exhaust port, for enclosing a substrate;
   a housing disposed within said vacuum chamber for enclosing a material to be vaporized;
   a laser beam introducing tubular member disposed to extend through a wall of said chamber and open into said housing;
   wherein said material disposed in said housing is irradiated with a laser beam entering through said tubular member with a laser beam to vaporize said material in order to deposit a desired film on said substrate, vapor of said material being led to said substrate through a window formed in a wall of said housing;
   means for introducing a gas into said tubular member, whereby said gas follows said tubular member to contact said material;
   said gas being of a type which can prevent changes in properties of said material which could be caused by the irradiation with said laser beam.

20. A laser vapor deposition apparatus according to claim 19 wherein at least one of said material and said laser beam is movable so that the portion of the surface of said material to be irradiated with said laser beam changes.

21. A laser vapor deposition apparatus according to claim 19 wherein a shutter is disposed between said material to be vaporized and said substrate, said shutter being operated to shield the surface of said substrate during unstable evaporation.

22. A laser vapor deposition apparatus according to claim 19 wherein an additional exhaust port is provided in said housing, and gases to be exhausted from said housing are mainly exhausted through said additional exhaust port.

23. A laser vapor deposition apparatus according to claim 19 wherein said gas in the vicinity of the surface of said material is irradiated with an additional laser beam which can dissociate said gas, so that the reactivity of said gas is increased.

24. A laser vapor deposition apparatus according to claim 19 wherein electrodes of an electric field generator are disposed between said gas supply source and said material to be vaporized in order to convert the gas into plasma.

25. A laser vapor deposition apparatus according to claim 19 wherein said gas supply source is an ion gun.

26. A laser vapor deposition apparatus according to claim 19 wherein said gas supply source is an ozonizer.

27. A laser vapor deposition apparatus comprising:
a vacuum chamber;
said vacuum chamber being effective for containing a substrate to receive a layer of vapor deposition;
a housing in said vacuum chamber;
said housing being effective for containing a material to be evaporated;
an orifice in said housing permitting vaporized portions of said material to pass from said material to said substrate;
means for permitting impingement of a laser beam on a surface of said material, whereby said surface is evaporated;
a gas supply;
said gas supply including means for delivering a supply of said gas to said surface; and
means for exhausting said gas from said housing, without permitting a substantial part of said gas from approaching said substrate.

* * * * *